United States Patent [19]
Askew et al.

[11] Patent Number: 6,091,165
[45] Date of Patent: Jul. 18, 2000

[54] METHOD AND APPARATUS TO REDUCE PEAK ELECTRO-MAGNETIC EMISSIONS FROM GROUND AND POWER PLANES

[75] Inventors: Raymond P. Askew, Hillsboro; Jeffrey W. Day, Portland, both of Oreg.

[73] Assignee: Intel Corporation, Santa Clara, Calif.

[21] Appl. No.: 09/216,317

[22] Filed: Dec. 18, 1998

[51] Int. Cl.$^7$ .................................................. H04B 3/28
[52] U.S. Cl. .......................... 307/89; 307/407; 307/409
[58] Field of Search ........................... 307/89, 407, 409, 307/106; 381/94.1, 94.2, 71.1, 94.7; 326/93; 327/99

[56] References Cited

U.S. PATENT DOCUMENTS

| | | | |
|---|---|---|---|
| 4,419,629 | 12/1983 | O'Brien | 328/72 |
| 4,769,847 | 9/1988 | Taguchi | 381/94 |
| 5,264,746 | 11/1993 | Ohmae et al. | 307/480 |

*Primary Examiner*—Stephen W. Jackson
*Assistant Examiner*—Sharon Polk
*Attorney, Agent, or Firm*—Blakely, Sokoloff, Taylor & Zafman LLP

[57] ABSTRACT

A method and an apparatus reduce peak electro-magnetic (EM) emissions from power and ground planes in, for example, a printed circuit board (PCB) by phase shifting synchronous signal sources to distribute EM emissions over a frequency range and by canceling at least some EM emissions with an inverse signal. According to one aspect of the present invention, two signal sources provide periodic outputs having the same period. The output of one of the signal sources, however, is delayed with respect to the output of the other signal source. Each signal source is coupled to a signal trace. The propagation delay over the signal trace coupled to the delayed signal source is shorter than the propagation delay over the other signal trace by the amount of the delay between the respective output signals. According to another aspect of the present invention, a noise cancellation driver is coupled to a signal source, a power or ground plane of the signal source, and an inverse voltage plane. The noise cancellation driver drives an inverse signal from the inverse voltage plane onto the power or ground plane when the signal source asserts a signal on the power or ground plane.

21 Claims, 10 Drawing Sheets

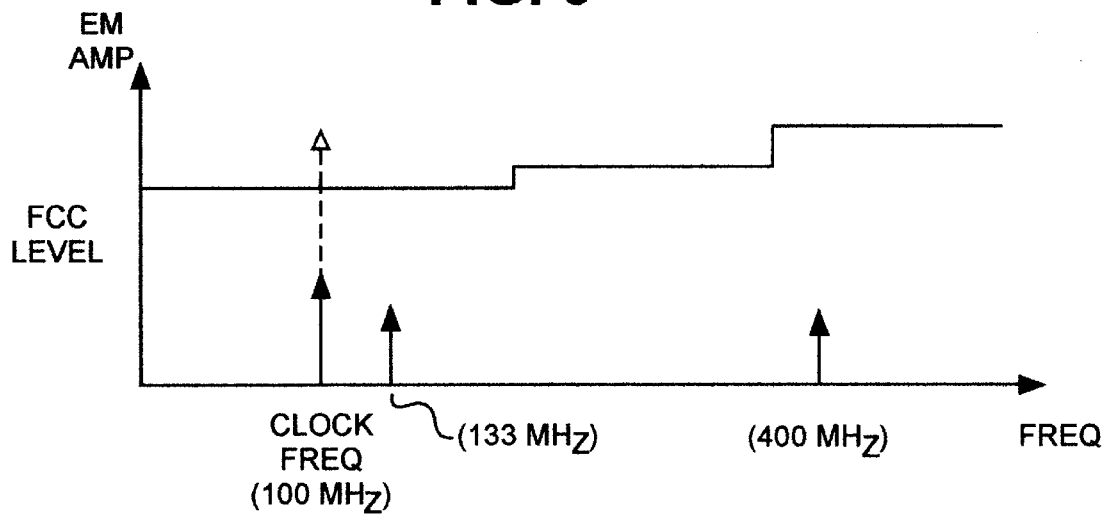
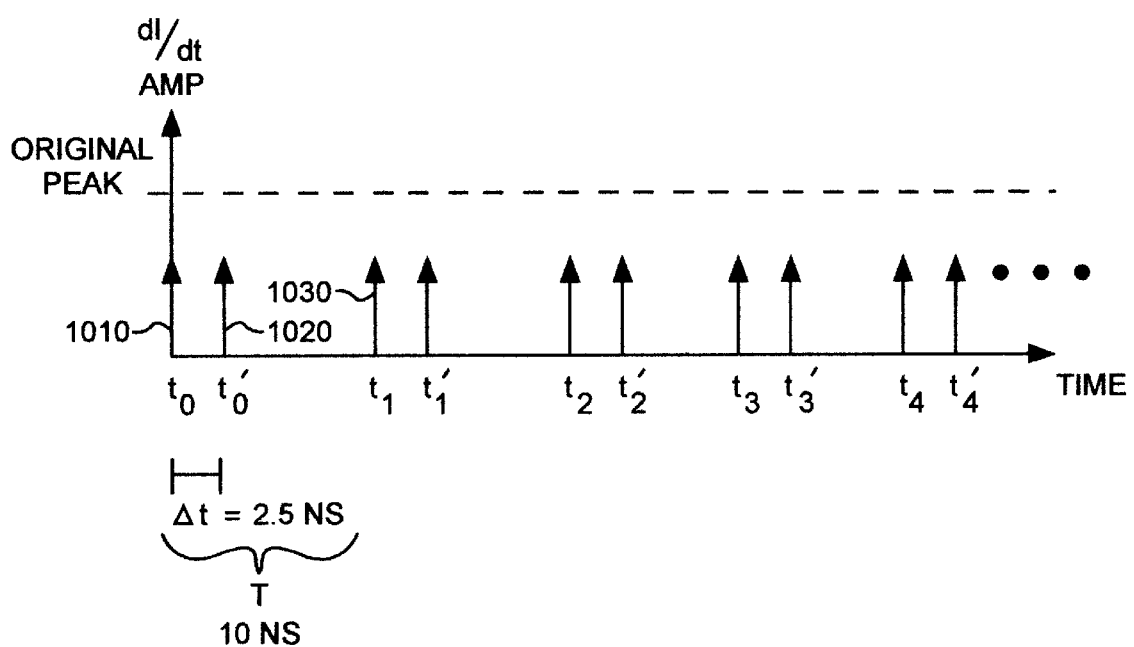

METHOD AND APPARATUS TO REDUCE PEAK ELECTRO-MAGNETIC EMISSIONS FROM GROUND AND POWER PLANES

BACKGROUND OF THE INVENTION

1. Field of the Invention

The present invention pertains to the field of electromagnetic (EM) emissions. More particularly, this invention relates to reducing peak EM emissions from a ground plane and a power plane of a printed circuit board (PCB).

2. Background

A wide variety of electrical components have become part of everyday life. In a typical day, a person may use an alarm clock, a computer, a television, and countless other electric powered tools and gadgets. The electric current used to operate each of these components produces both electric fields and magnetic fields, collectively referred to herein as electromagnetic (EM) fields.

As current passes through a conductor, the conductor acts like an antenna to transmit EM fields into the surrounding environment, much like a radio transmission antenna. Conversely, when a conductor is placed in an EM field, current is generated in the conductor, much like a radio reception antenna. So, the EM fields emitted by one electric component can induce electric current, or EM interference (EMI), in another electric component. If the amplitude of the EMI is high enough, it may disrupt normal operations. In order to ensure that electrical components can operate in close proximity to one another, various governing bodies, such as the Federal Communications Commission (FCC) in the United States, impose restrictions on EMI.

Printed circuit boards (PCBs), to which integrated circuits are coupled, can generate relatively large EM emissions. For instance, a power plane and a ground plane in a PCB act like antennas. For each clock cycle of an integrated circuit, numerous transistors may simultaneously draw current off the power plane or drive current onto the ground plane. These simultaneous current fluctuations from the power plane or onto the ground plane can cumulatively create large amplitude EM emissions.

As transistor densities increase for integrated circuits, the EMI restrictions become increasingly difficult to meet. Various cost-added techniques, such as noise filtering, can reduce EM emissions from PCBs. The large copper planes, however, and ground planes in particular, are very difficult to filter effectively, making power and ground planes large contributors to EM emissions.

Therefore, a need exists for a method and apparatus to reduce peak EM emissions from power and ground planes.

SUMMARY OF THE INVENTION

A method and an apparatus reduce peak electro-magnetic (EM) emissions from power and ground planes in, for example, a printed circuit board (PCB) by phase shifting synchronous signal sources to distribute EM emissions over a frequency range and by canceling at least some EM emissions with an inverse signal.

According to one aspect of the present invention, two signal sources provide periodic outputs having the same period. The output of one of the signal sources, however, is delayed with respect to the output of the other signal source, thus reducing peak EM emissions by distributing the emissions over two or more frequencies. Each signal source is coupled to a separate signal trace. The propagation delay over the signal trace coupled to the delayed signal source is shorter than the propagation delay over the other signal trace by the amount of the delay between the respective output signals in order to maintain necessary system timing.

According to another aspect of the present invention, a noise cancellation driver is coupled to the ground plane of a signal source and an inverse voltage plane. The noise cancellation driver drives an inverse signal from the inverse voltage plane onto the ground plane when the signal source drives a signal on the ground plane in order to cancel EM emissions from the ground plane.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

FIGS. 9 and 10 illustrate the effect of a 90° phase delay on a 100 MHz clock signal in the frequency and time domains respectively.

DETAILED DESCRIPTION

A power plane and a ground plane of a printed circuit board (PCB) can be significant sources of electro-magnetic (EM) emissions. This is particularly true when multiple signal sources simultaneously draw current from a power plane or drive current into a ground plane. As discussed below, the present invention reduces peak EM emissions by distributing emissions over multiple frequencies and/or by canceling at least a portion of emissions.

The present invention will be discussed below with reference to a clock driver and a plurality of synchronous dynamic random access memories (SDRAM) on a PCB. After reading the description below however, those skilled in the art will recognize that the present invention is similarly applicable to a wide range of signal sources and loads in various embodiments, such as a system on a chip.

Figure 1:
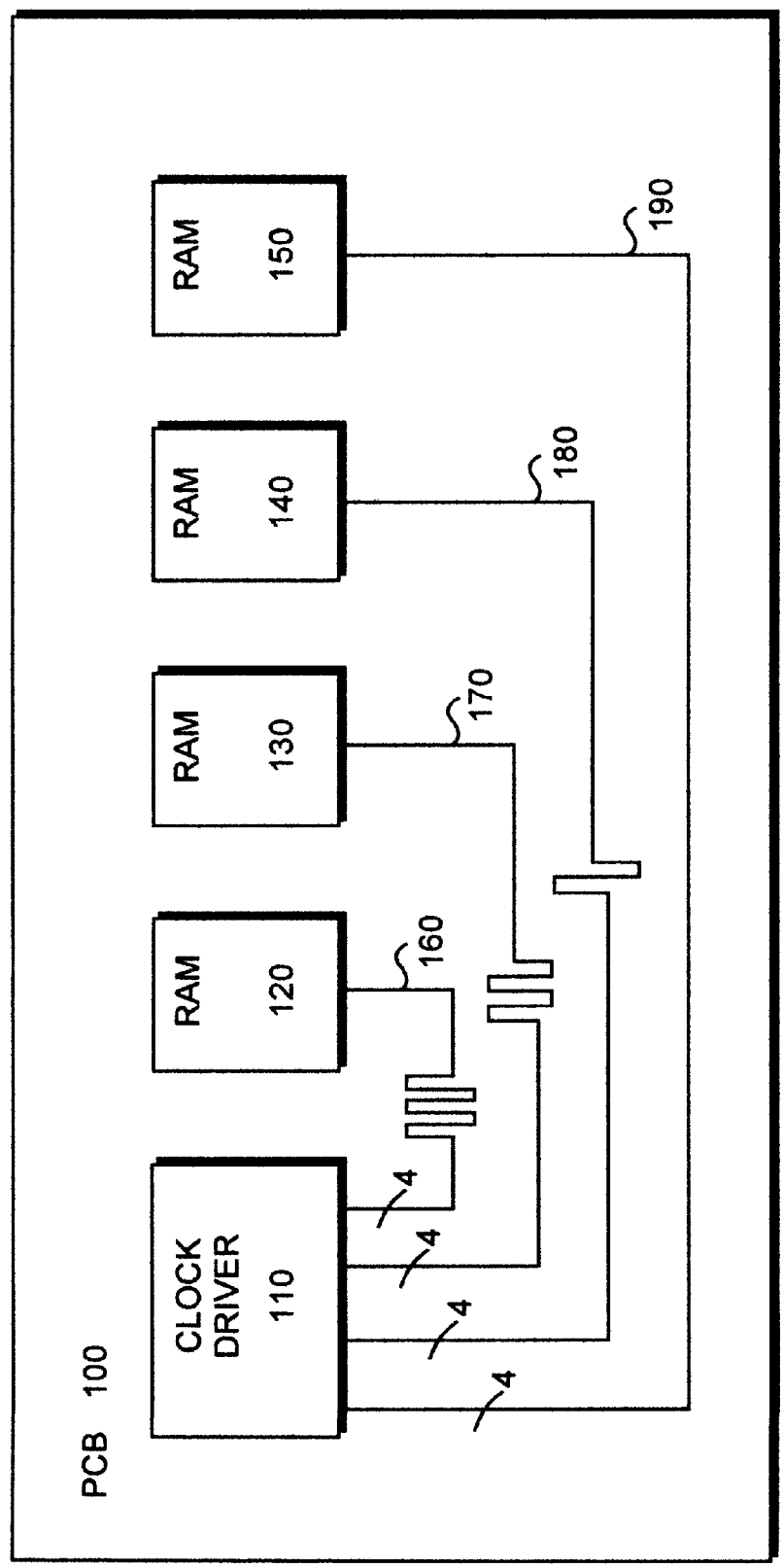
FIG. 1 illustrates one embodiment of the present invention.

FIG. 1 illustrates one embodiment of the present invention. A clock driver 110 and four SDRAMs, 120, 130, 140, and 150, are coupled to a PCB 100. Clock driver 110 and clock traces 160, 170, and 180, and 190 are configured to provide synchronous clock signals to RAMs 120, 130, 140, and 150. According to a first aspect of the present invention, rather than using 16 synchronous clock driver circuits within clock driver 110, the present invention intentionally phase delays one or more of the clock driver circuits so that less than 16 clock driver circuits are switched synchronously. In order to compensate for the phase delays, the propagation delays over the respective clock traces are designed (by manipulation of trace length, for instance) so that the clock signals are re-synchronized at the inputs to RAMs 120, 130, 140, and 150.

Figure 2:
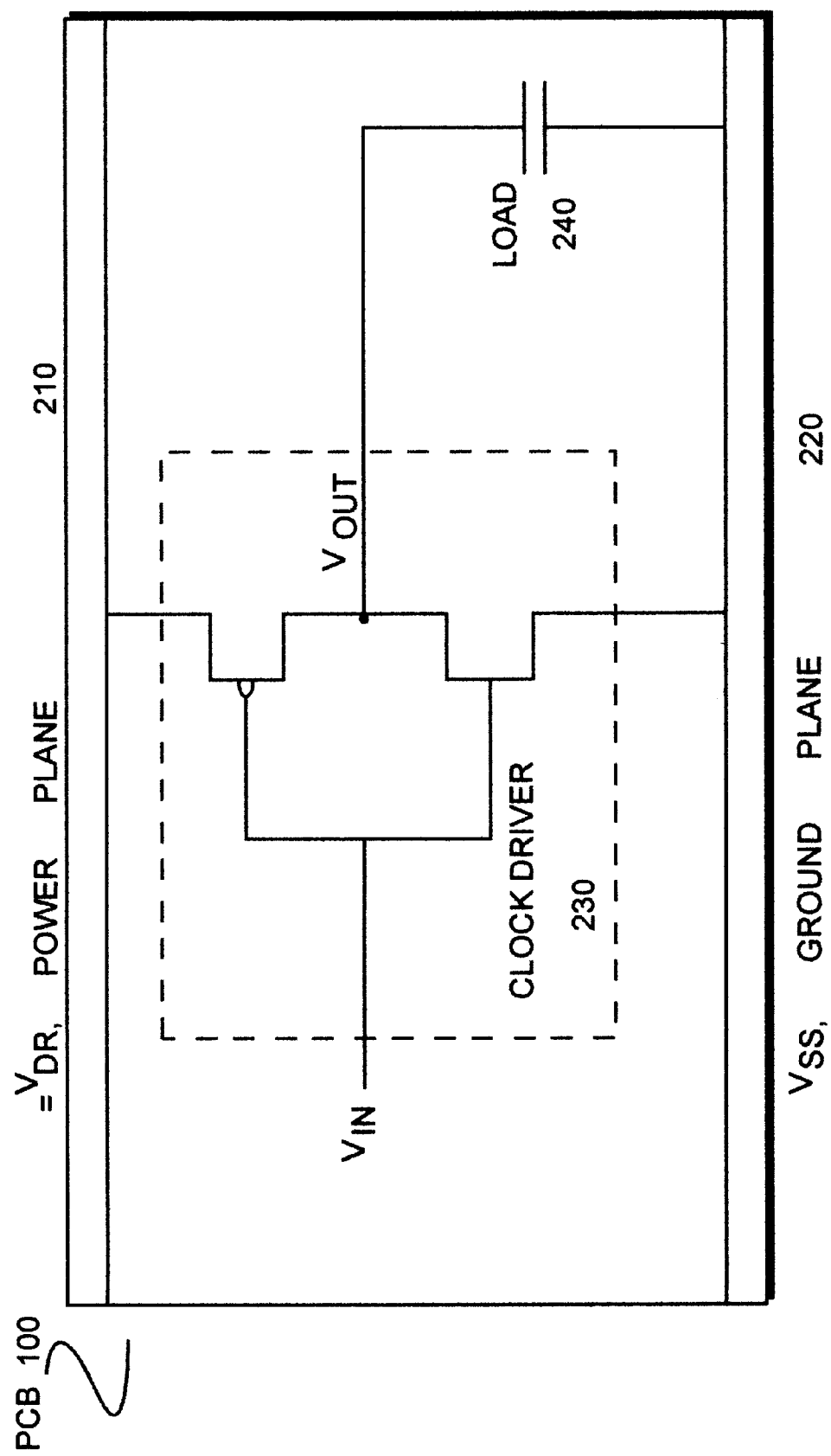
FIG. 2 illustrates one embodiment of a clock driver circuit.

FIG. 2 illustrates one embodiment of a clock driver circuit 230 within clock driver 110 (not illustrated) coupled to PCB 100. PCB 100 includes power plane 210 and ground plane 220. When $V_{IN}$ transitions from low voltage to high voltage, clock driver circuit 230 draws current from power plane 210 and drives the current onto load 240. Load 240 represents a clock input on one of the RAMs from FIG. 1. When $V_{IN}$ transitions from high voltage to low voltage, clock driver circuit 230 draws current from load 240 and drives the current onto ground plane 220.

Figure 3:
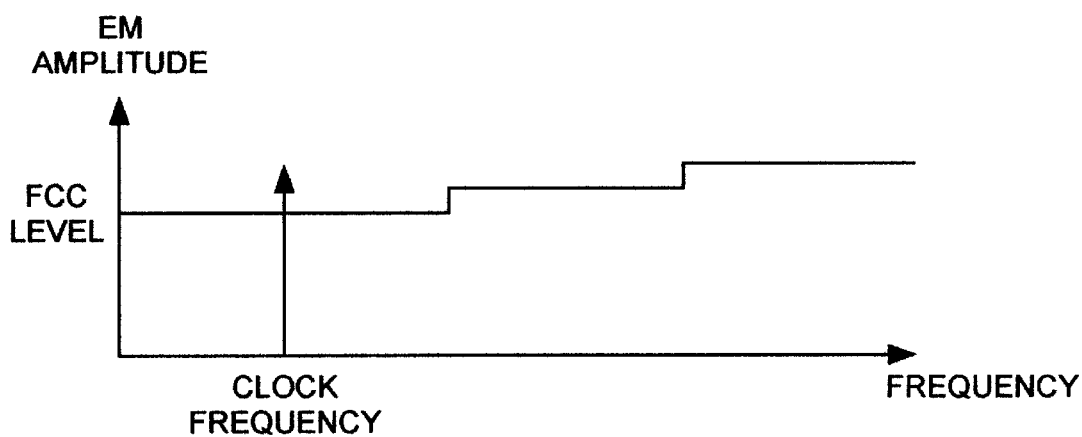
FIG. 3 illustrates peak EM emissions at a clock frequency with reference to FCC EMI limits.
Figure 4:
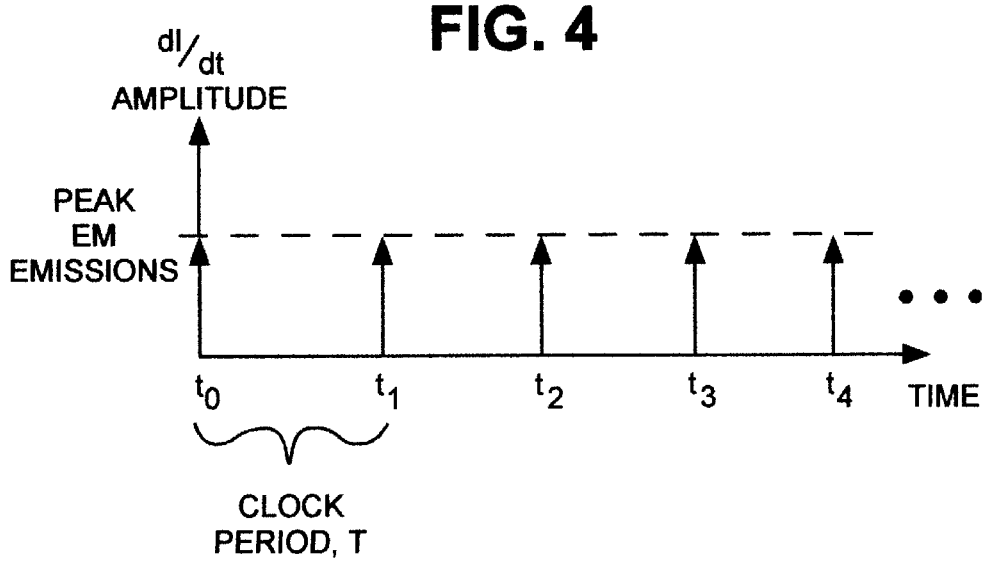
FIG. 4 illustrates periodic peak EM emissions in the time domain.

If 16 clock driver circuits 230 are synchronously switched, a large amplitude EM field could be emitted from power plane 210 and ground plane 220 at the clock frequency. As shown in FIG. 3, the EM emission could result in a peak at the clock frequency that is over the maximum legal EMI amplitude allowed by law. FIG. 4 illustrates the cumulative peak EM emissions from 16 synchronous clock driver circuits 230 as a function of time.

Figure 5:
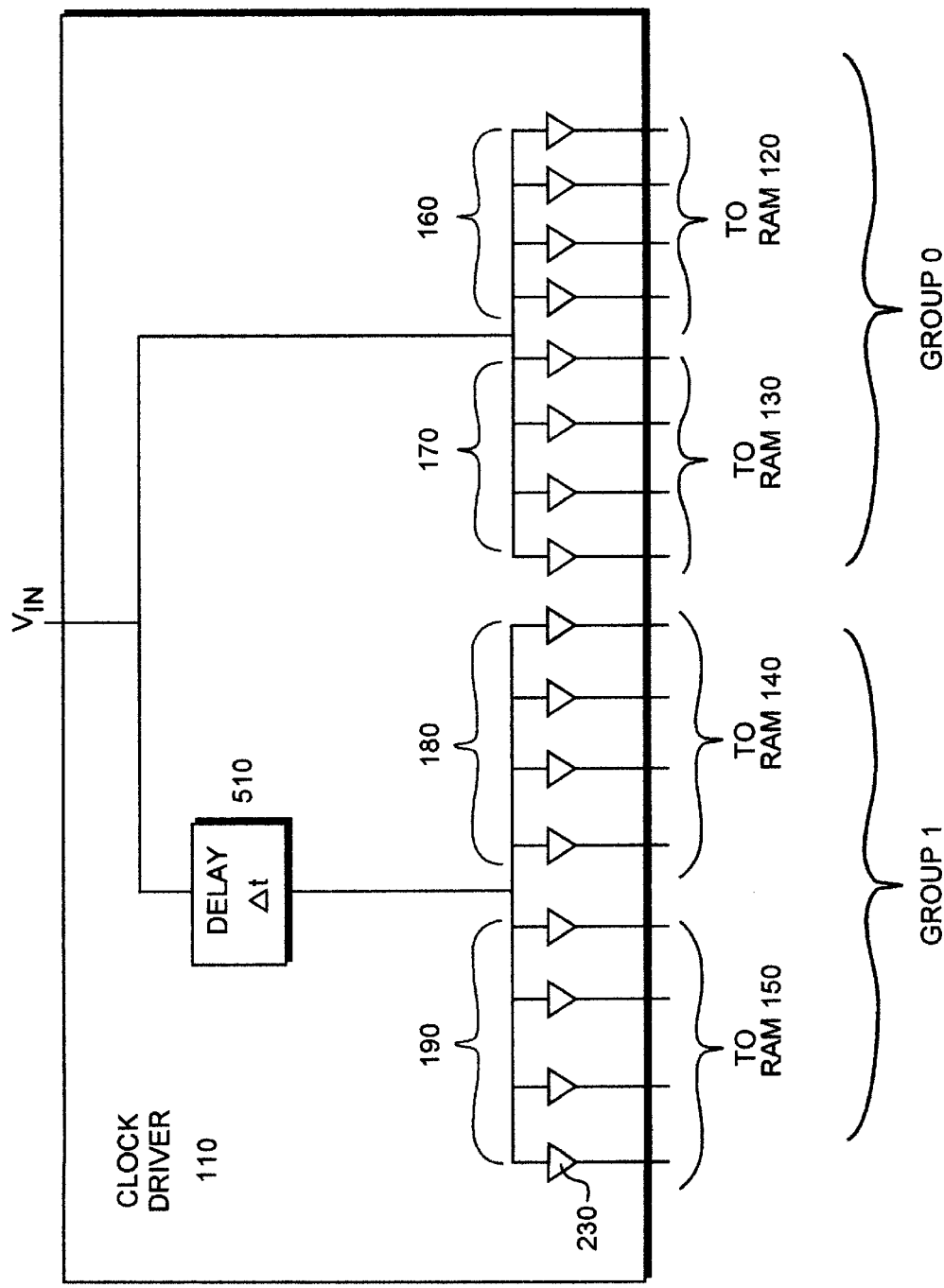
FIG. 5 illustrates one embodiment of a clock driver.
Figure 6:
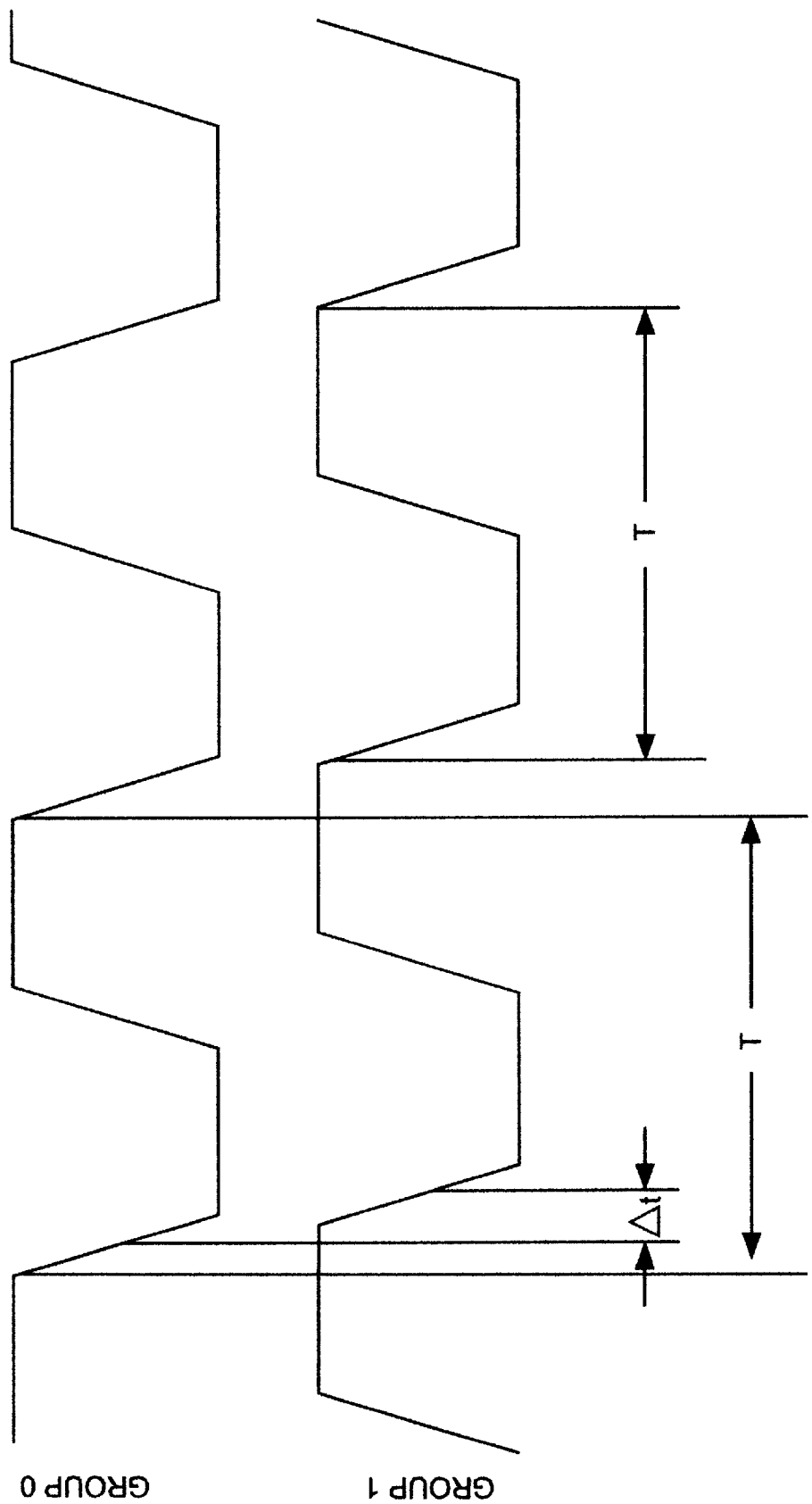
FIG. 6 illustrates a phase delay between groups of signals.

By phase delaying one or more clock driver circuits, the EM emissions can be distributed in time and frequency thereby reducing peak EM emissions. Clock driver 110 represents any of a number of asynchronous clock drivers that can phase delay one or more of the clock signals. One example is shown in FIG. 5, which includes 16 individual clock driver circuits 230. In the illustrated embodiment, clock driver 110 introduces a delay 510 on the clock signals provided to RAMs 140 and 150. As illustrated in FIG. 6, the clock frequency and period T for group 0 remains equal to group 1, but group 1 is phase delayed Δt with respect to group 0.

Figure 7:
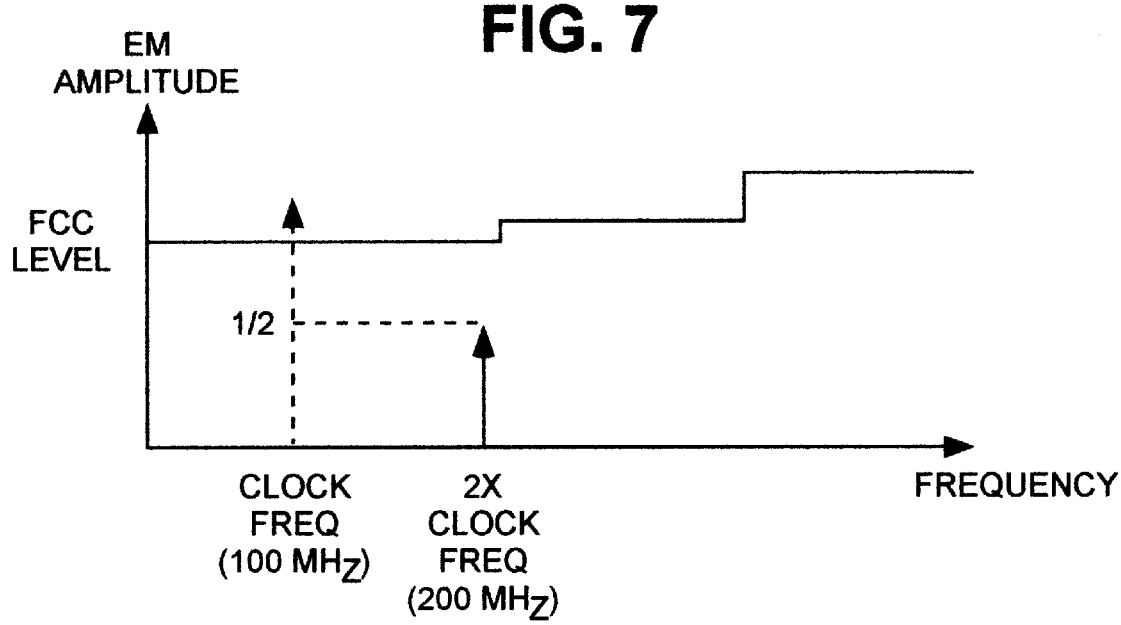
FIGS. 7 and 8 illustrate the effect of a 180° phase delay on a 100 MHz clock signal in the frequency and time domains respectively.
Figure 8:
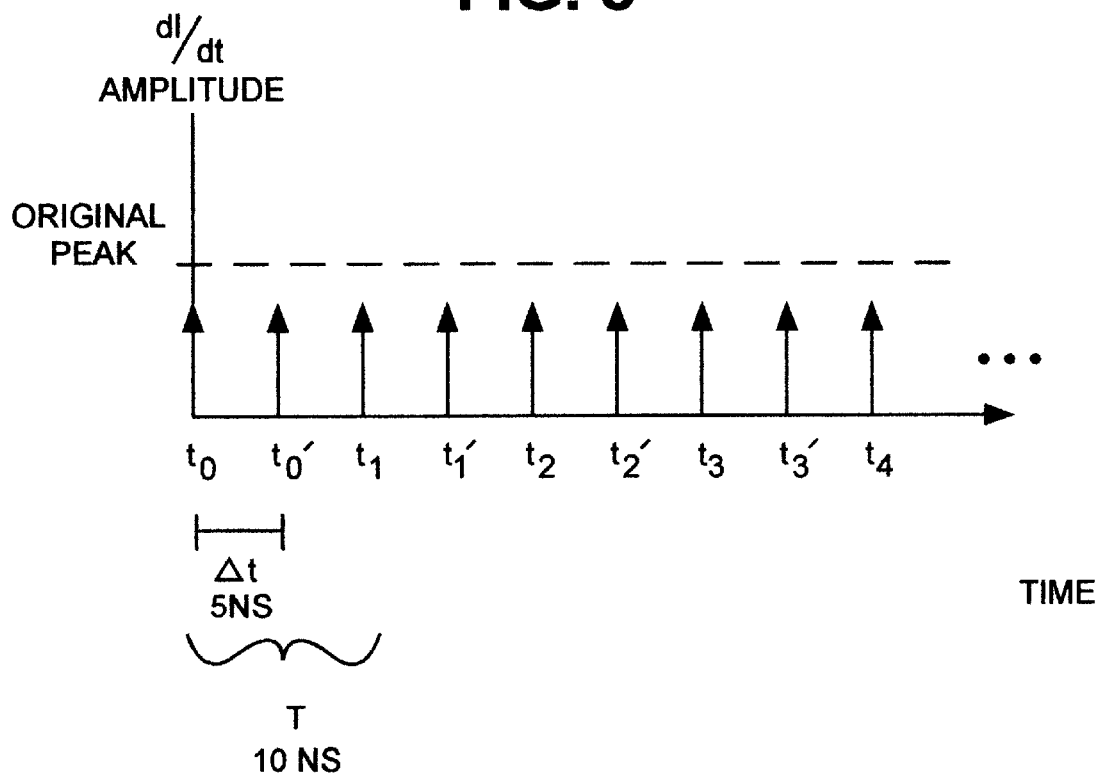

FIGS. 7 and 8 illustrate the peak EM emissions caused by clock driver 110 as functions of frequency and time for a phase delay of 180°. For instance, if the clock frequency is 100 MHz, the period is T=10 ns. A 180° phase delay is equal to one-half the period, or Δt=5 ns. Half the clock driver circuits switch at $t_0$, $t_1$, $t_2$, etc., and half the clock driver circuits switch at $t_0'$, $t_1'$, $t_2'$, etc. From the perspective of the power plane or ground plane, half as much current is driven at any one time, but the current is driven twice as often. That is, as illustrated in FIGS. 7 and 8, the peak EM emissions are reduced by 50%, but the effective frequency is doubled to 200 MHz.

FIGS. 9 and 10 illustrate the EM emissions for a 100 MHz clock frequency (T=10 ns) and a 90° phase delay (Δt=2.5 ns). As seen in the time domain, peak current surges (dI/dt) are reduced by 50% because only half of the clock driver circuits are driving at any one time. The principle frequencies of the emissions are derived from the periods between peaks within a single periodic sample, such as clock period T. For instance, there are principle frequencies for the period between a first clock edge 1010 for group 0 and a first clock edge 1020 for group 1 (Δt=2.5 ns), the period between the first clock edge 1020 for group 1 and the next clock edge 1030 for group 0 (T−Δt=7.5 ns), and the period between the first clock edge 1010 for group 0 and the next clock edge 1030 for group 0 (T=10 ns). Therefore, in the illustrated example, the principle frequencies are 400 MHz, 133.333 MHz, and 100 MHz, respectively.

Those skilled in the art will recognize that an infinite number of phase delays could be introduced to distribute peak emissions from the clock driver over an infinite variety of principle frequencies. Those skilled in the art will also recognize that a 270° phase delay produces the same result as a 90° phase delay because the Δt is the same for both phase delays. That is, phase delays longer than half the clock period have duplicate principle frequencies with phase delays below 180°. In which case, only phase delays up to 180°, or one half the clock period, will distribute the peak EM emissions to unique sets of principle frequencies.

In alternate embodiments, any of a number of techniques can be used to phase delay one or more signal source outputs. The number of signal sources can also be greater than or less than 16. In an N signal source system, up to N−1 phase delays can be introduced to distribute EM emissions to different sets of principle frequencies for each signal output or each set of equally delayed signal outputs.

Phase delays can also be introduced to design around other EM sources on a PCB or within an electrical appliance containing a PCB. For instance, if another component resonates peak EM emissions at 150 MHz, the phase delay could be selected to avoid generating a new principle frequency at 150 MHz.

Those skilled in the art will recognized that the PCB and the clock driver can be separately manufactured components that may not be manufactured by the same party. In which case, one component could be manufactured to the design specifications of the other component to within a tolerance limit. For instance, in FIG. 1, the traces on PCB 100 could be routed to provide synchronous clock signals to RAMs 120, 130, 140, and 150 based on a 90° phase delay between RAMs 120 and 130, and RAMs 140 and 150, to within 0.5°. In which case, clock driver 110 could be designed to meet the design criteria established for PCB 100. Phase delay and propagation delay differentials could both be designed to be within particular tolerance limits.

In another embodiment, clock driver 110 includes both the phase delay and the propagation delay. For instance clock driver 110 could be an application specific integrated circuit (ASIC) with phase delayed clock driver circuits, wherein the ASIC further delays the output propagation of the non-phase delayed clock driver circuits to provide a synchronous output from the ASIC. In which case, a signal source with distributed EM emissions could be retrofitted to PCBs designed for synchronous signal sources.

In order to match the phase delays and the propagation delays to provide synchronous signals, length is generally added to or removed from traces. Certain traces in existing PCB designs may already include additional length. For instance, in FIG. 1, the distance between clock driver 110 and RAM 120 is considerably shorter than the distance between clock driver 110 and RAM 150. If trace 160 where routed over the shortest distance, the propagation delay over trace 160 could be considerably shorter than the propagation delay over trace 190. If the clock signals were synchronous at the output of clock driver 110, the clock signals may be far enough out of phase by the time they reach the RAMs to cause memory errors. For this reason, additional length may be added to traces 160, 170, and 180 so that the propagation delays over all four sets of traces are equal.

By phase delaying certain signals from the clock driver, certain traces may not need the additional propagation delay. In which case, a phase distributed signal source can save valuable real estate on a PCB, and reduce PCB production costs. That is, rather than adding length to certain traces to increase the propagation delay for non-phase shifted signals, it may be easier to remove length from a trace in an exist design. For instance, if the traces on PCB 100 were routed over the shortest distances between the respective clock driver ports and RAM ports, clock driver 110 could be designed to phase delay the clock signals to match the respective propagation delays. In general, removing extra length from traces may save production costs and save board real estate for other components, as well as reducing emissions from the traces themselves.

Phase distributed signal sources can also save production costs in other areas. For instance, if peak EM emissions are sufficiently reduced by phase delaying, then other EM reduction measures may be removed from a PCB design. For instance, various noise filter circuits may be eliminated.

In the illustrated embodiment of FIG. 1, all four traces in a set of traces coupled to a particular RAM are equally phase shifted. In alternate embodiments, traces within a set of traces can be phase delayed with respect to one another. For instance, the first and third traces in each of traces 160, 170, 180, and 190 of FIG. 1 could be phased delayed by Δt with respect to traces two and four. Then, if PCB 100 includes memory interfaces for four RAMs, but less than four RAMs are coupled, the EM emissions resulting from driving clock signals to each RAM that is coupled to the PCB will still be distributed.

Figure 11:
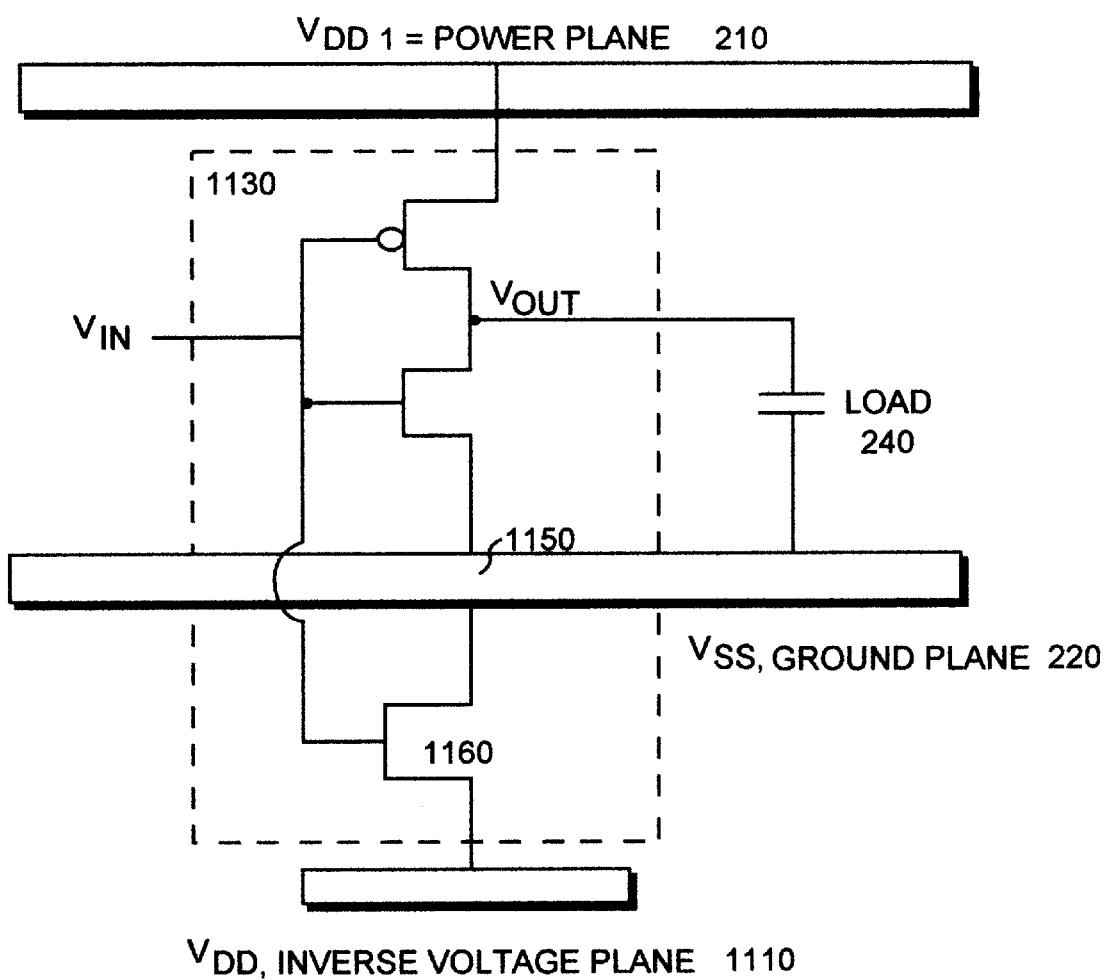
FIG. 11 illustrates one embodiment of a noise cancellation driver.

FIG. 11 illustrates a second aspect of the present invention to reduce peak EM emissions from a ground plane. A clock driver circuit 1130 could be used in place of clock driver circuit 230 from FIG. 2. Clock driver circuit 1130 includes a noise cancellation driver 1160. Noise cancellation driver 1160 is coupled to ground plane 220 at approximately the same position 1150 as clock driver circuit 1130. When VIN transitions from high voltage to low voltage, clock driver circuit 1130 draws current from load 240 and drives the current to ground plane 220.

Figure 12:
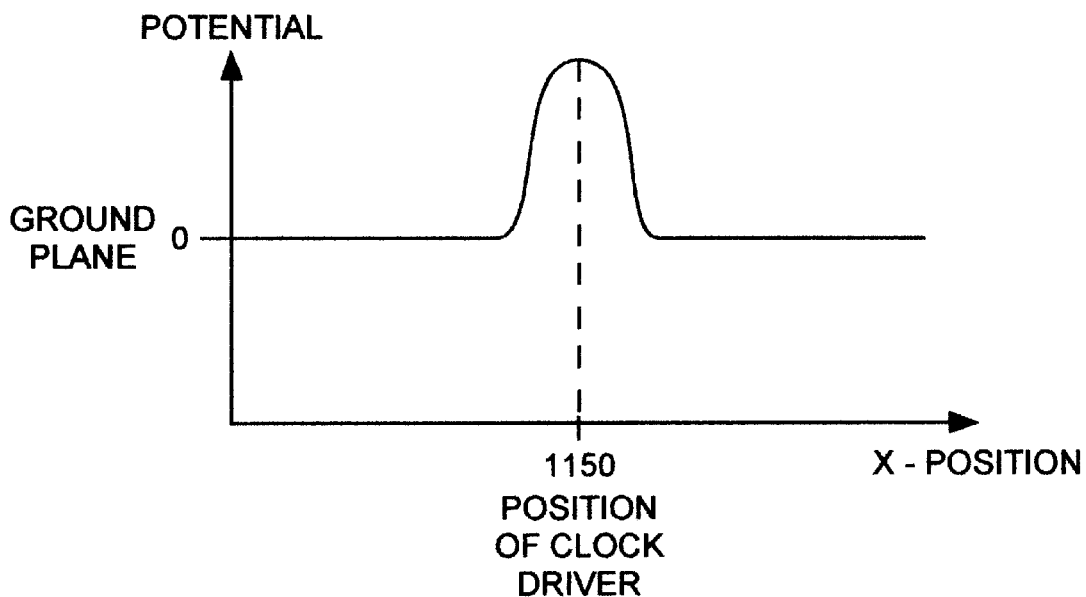
FIGS. 12 and 13 illustrate a signal asserted on a plane and an inverse noise cancellation signal simultaneously driven to the plane.

FIG. 12 illustrates the voltage potential with respect to position in one coordinate direction on ground plane 220. In the illustration, an instant after current is driven onto ground plane 220, the voltage potential at position 1150 has increased. Over time, the increased potential will propagate out over ground plane 220 like wave fronts on a pond after a pebble is dropped in the water. Eventually, the wave fronts dissipate and the plane normalizes back to the reference voltage. The current wave fronts travelling through ground plane 220 create EM emissions.

Figure 13:
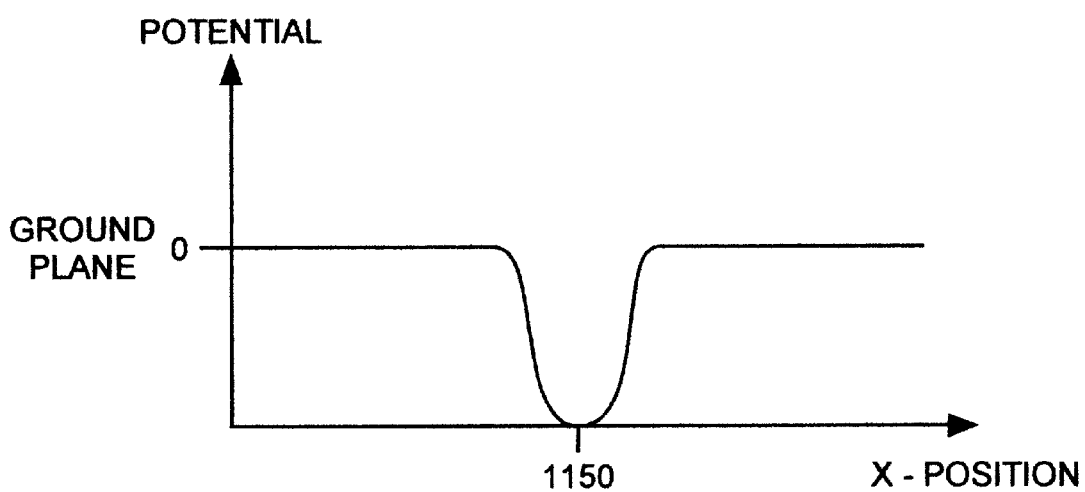

As illustrated in FIG. 13, however, noise cancellation driver 1 160 simultaneously drives a "negative" signal onto ground plane 220 at position 1150 from inverse voltage plane 1110. Depending on how closely matched the inverse signal is to the signal driven onto the ground plane from load 240, the inverse signal cancels at least a portion of the wave fronts propagating in plane 220. As a result, the EM emissions from ground plane 220 can be significantly reduced.

Although EM emissions from ground plane 220 are reduced, EM emissions are created in inverse voltage plane 1110 when the inverse signal is driven from inverse voltage plane 1110 to ground plane 220. There is an advantage, however, to shifting the EM emissions to the inverse voltage plane. It is very difficult to filter noise from ground plane 220. Ground plane 220 is supposed to provide a reference voltage for the entire PCB. Filters may cause charge to be retained on the ground plane, resulting in a voltage potential that may interfere with one or more components somewhere on the PCB.

Figure 14:
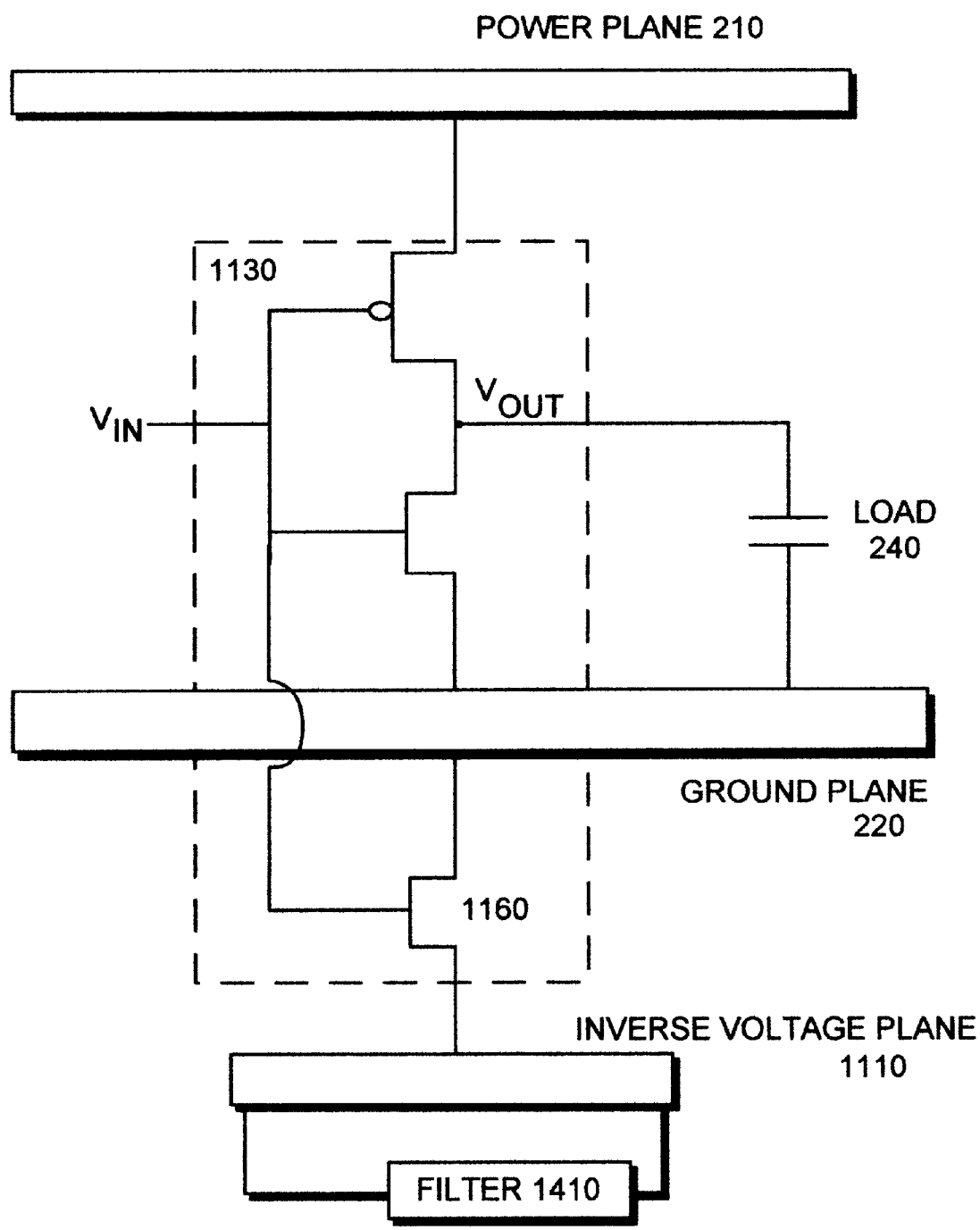
FIG. 14 illustrates one embodiment of a filtered noise cancellation driver.

Inverse voltage plane 1110, however, is easy to filter, or at least easier and less expensive to filter than ground plane 220. As illustrated in FIG. 14, inverse voltage plane 1110 can be localized to the clock driver so that variations in potential will not interfere with other components on the PCB. Then, inverse voltage plane 1110 can be filtered with filter 1410. Various other EM reduction techniques can also be employed to filter noise out of the inverse voltage plane.

Even without phase delaying synchronous signal sources, the noise cancellation driver can cancel at least a portion of the EM emissions from the ground plane on a printed circuit board (PCB). Those skilled in the art will recognize that the noise cancellation driver is applicable to reducing ground plane EM emissions for any signal source, not just multiple synchronous signal sources.

Thus, a method and apparatus to reduce peak electromagnetic (EM) emissions from power and ground planes is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. An apparatus comprising:
    a first signal source to switch a first output periodically with a particular period;
    a second signal source to switch a second output periodically with the particular period and at a delayed switching time from the first signal source;
    a first signal trace to couple to the first output, said first signal trace having a first propagation delay; and
    a second signal trace to couple to the second output, said second signal trace having a second propagation delay equal to the first propagation delay minus the delayed switching time.

2. The apparatus of claim 1 wherein at least one of the delayed switching time, the first propagation delay, and the second propagation delay include a tolerance limit.

3. The apparatus of claim 1 wherein the first and second signal sources are clock drivers.

4. The apparatus of claim 1 further comprising:
    a first plurality of signal sources to switch simultaneously with the first signal source;
    a second plurality of signal sources to switch simultaneously with the second signal source;
    a first plurality of signal traces to couple to the first plurality of signal sources, said first plurality of signal traces having the first propagation delay; and
    a second plurality of signal traces to couple to the second plurality of signal sources, said second plurality of signal traces having the second propagation delay.

5. The apparatus of claim 1 further comprising:
    N signal sources, said N signal sources including the first and the second signal sources, each of said N signal sources to switch a corresponding output periodically with the particular period and at a particular delay that is incrementally longer between one signal source and a next signal source by the delayed switching time; and
    N signal traces coupled to the N signal sources respectively, said N signal traces including the first and second signal traces, each of said N signal traces having a different particular propagation delay wherein a given particular propagation delay is incrementally shorter between one signal trace and a next signal trace by the delayed switching time.

6. The apparatus of claim 4 wherein the delayed switching time is equal to one-half the particular period divided by N−1.

7. The apparatus of claim 1 further comprising:

an inverse voltage plane; and a noise cancellation driver to couple to the first signal source, the inverse voltage plane, and a terminal plane of the first signal source, said noise cancellation driver to drive an inverse signal from the inverse voltage plane to the terminal plane when the first signal source asserts a signal on the terminal plane, said inverse signal to be substantially inverse to the signal asserted on the terminal plane by the first signal source.

8. The apparatus of claim 1 further comprising:

an application specific integrated circuit (ASIC) including the first and second signal sources; and a printed circuit board (PCB) to couple with the ASIC, said PCB including the first and second signal traces.

9. The apparatus of claim 1 further comprising:

an application specific integrated circuit (ASIC) including the first and second signal sources and the first and second signal traces.

10. The apparatus of claim 1 wherein the first and second signal traces are further to couple the first and second signal sources to a memory interface.

11. An apparatus comprising:

an inverse voltage plane; and a noise cancellation driver to couple to the inverse voltage plane, a signal source, and a terminal plane of the signal source, said noise cancellation driver to drive an inverse signal from the inverse voltage plane to the terminal plane when the signal source asserts a signal on the terminal plane, said inverse signal to be substantially inverse to the signal asserted on the terminal plane by the signal source.

12. The apparatus of claim 11 wherein the terminal plane is a ground plane.

13. The apparatus of claim 11 wherein the inverse voltage plane has a voltage that is substantially inverse to the voltage on a power plane of the signal source.

14. The apparatus of claim 11 wherein the inverse voltage plane is localized to the signal source.

15. The apparatus of claim 11 further comprising:

a noise filter, coupled to the inverse voltage plane, to filter electro-magnetic (EM) emissions from the inverse voltage plane.

16. An apparatus comprising:

a first signal source port to couple with a first signal source, said first signal source to switch a first output periodical ly with a particular period;

a second signal source port to couple with a second signal source, said second signal source to switch a second output periodically with the particular period and at a delayed switching time from the first signal source;

a first signal trace to couple to the first signal source port, said first signal trace having a first propagation delay; and a second signal trace to couple to the second signal source port, said second signal trace having a second propagation delay equal to the first propagation delay minus the delayed switching time.

17. The apparatus of claim 16 further comprising:

a printed circuit board (PCB), said PCB including the first and second signal source ports and the first and second signal traces.

18. A method comprising:

determining a delayed switching time from a first periodic signal generated by a first signal source and a second periodic signal generated by a second signal source, said first and second periodic signals having a particular period;

routing a first sign al trace having a first propagation delay, said first signal trace to couple the first signal source to a first load; and routing a second signal trace having a second propagation delay, said second signal trace to couple the second signal source to a second load, said second propagation delay being equal to the first propagation delay minus the delayed switching time.

19. A method comprising:

switching a first signal source with a particular period;

switching a second signal source with the particular period and at a delayed switching time from the first signal source;

receiving a first periodic signal from the first signal source over a first signal trace, said first signal trace having a first propagation delay; and receiving a second periodic signal from the second signal source over a second signal trace, said second signal trace having a second propagation delay equal to the first propagation delay minus the delayed switching time.

20. A method comprising:

driving an inverse signal from an inverse voltage plane to a terminal plane of a signal source when the signal source asserts a signal on the terminal plane, said inverse signal being substantially inverse to the signal asserted on the terminal plane by the signal source.

21. A method comprising:

coupling an inverse voltage plane to a signal source; and coupling a noise cancellation driver to the inverse voltage plane, the signal source, and a terminal plane of the signal source, the noise cancellation driver to drive an inverse signal from the inverse voltage plane to the terminal plane when the signal source asserts a signal on the terminal plane, said inverse signal to be substantially inverse to the signal asserted on the terminal plane by the signal source.

* * * * *